US008194897B2

(12) United States Patent
Choi

(10) Patent No.: US 8,194,897 B2
(45) Date of Patent: Jun. 5, 2012

(54) SPEAKER SYSTEM

(75) Inventor: Jung Woo Choi, Goyang-si (KR)

(73) Assignee: LG Electronics Inc., Seoul (KR)

( * ) Notice: Subject to any disclaimer, the term of this patent is extended or adjusted under 35 U.S.C. 154(b) by 1462 days.

(21) Appl. No.: 11/730,843

(22) Filed: Apr. 4, 2007

(65) Prior Publication Data

US 2008/0063225 A1 Mar. 13, 2008

(30) Foreign Application Priority Data

Sep. 11, 2006 (KR) ........................ 10-2006-0087420

(51) Int. Cl.
*H04R 25/00* (2006.01)
*H04R 1/02* (2006.01)
*H05K 5/00* (2006.01)

(52) U.S. Cl. ......... 381/182; 381/386; 181/148; D14/204

(58) Field of Classification Search .................... 381/79, 381/87, 182, 186, 332–335, 386, 387, 395; 181/145, 147, 148; D14/172, 204, 209.1, D14/215, 224; 455/575.4
See application file for complete search history.

(56) References Cited

U.S. PATENT DOCUMENTS

| | | | | |
|---|---|---|---|---|
| 3,090,462 | A * | 5/1963 | Huff et al. | 181/145 |
| 3,126,450 | A * | 3/1964 | Neil et al. | 381/75 |
| 4,441,577 | A * | 4/1984 | Kurihara | 381/182 |
| 2004/0023697 | A1 * | 2/2004 | Komura | 455/575.1 |
| 2006/0222190 | A1 | 10/2006 | Jacobs et al. | |

* cited by examiner

*Primary Examiner* — Jesse Elbin

(74) *Attorney, Agent, or Firm* — Birch, Stewart, Kolasch & Birch, LLP

(57) ABSTRACT

A speaker system includes a body unit, a front panel slidably coupled to a front surface of the body unit, a first speaker unit that is provided on the front surface the body unit to output sound, and a second speaker unit that is provided on a rear surface of the front panel to output sound.

21 Claims, 10 Drawing Sheets

SPEAKER SYSTEM

BACKGROUND OF THE INVENTION

1. Field of the Invention

The present invention relates to a speaker system. More particularly, the present invention relates to a speaker system that can realize a variety of sound filed effects by allowing sound to be emitted forward or forward and backward in accordance with a user's intension.

2. Description of the Related Art

Generally, a speaker is a device that finally emits sound. In a strict sense, the speaker may be construed as "speaker unit" or "speaker system."

The speaker unit is an assembly of a magnet, a voice coil surrounding the magnet, a diaphragm, and the like. The speaker system is a set having a plurality of speaker units arranged in a sound box and a terminal for connecting to an amplifier.

As home appliances using a speaker system, a home theater, an audio component, a TV set, and the like are well known. Recently, speaker systems that can provide a variety of sound field effects for a 3D sound have been developed.

However, in the convention speaker system, since the speaker unit for finally emitting the sound is designed to be fixed and positioned in a speaker box such that it can emit the sound only forward, it is difficult to realize the variety of the sound field effects in accordance with a user's intension.

Further, in order to provide the variety of the sound field effects, the conventional speaker system includes a plurality of speaker boxes that are installed to diversify a sound generation direction. In this case, the speaker boxes take up too much space.

SUMMARY OF THE INVENTION

An object of the present invention is to provide a speaker system that substantially obviates one or more problems due to limitations and disadvantages of the related art.

An object of the present invention is to provide a speaker system that can realize a variety of sound filed effects by allowing sound to be emitted forward or forward and backward in accordance with a user's intension.

Another object of the present invention is to provide a speaker system that can flexibly adjust a sound emission direction so that there is no need to install a plurality of speaker boxes, thereby making better use of a space.

Still another object of the present invention is to provide a speaker system that can emit sound forward or forward and backward in accordance with a sliding manipulation of a user.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a speaker system including: a body unit; a front panel slidably coupled to a front surface of the body unit; a first speaker unit that is provided on the front surface the body unit to output sound; and a second speaker unit that is provided on a rear surface of the front panel to output sound.

In another aspect of the present invention, there is provided a speaker system including: a body unit; a front panel slidably coupled to a front surface of the body unit; a guide unit for allowing the front panel to be slidably coupled to the body unit; a first speaker unit that is provided on the front surface the body unit to output sound; and a second speaker unit that is provided on a rear surface of the front panel to output sound, the second speaker unit being turned on when the first speaker unit is exposed.

In still another aspect of the present invention, there is provided a speaker system including: a body unit disposed on a base floor and provided at a front surface with a first speaker unit; a front panel that is coupled to a front surface of the body unit to be capable of sliding in a multiple-step and provided at a rear surface with a second speaker unit; and a sensing unit for sensing a sliding state of the front panel.

According to the above-described speaker system of the present invention, since the sound can be emitted forward or forward and backward in accordance with a user's intension, a variety of sound field effects can be realized.

Further, since the sound of the speaker unit is easily emitted forward or forward and backward by simply sliding a front panel, the user convenience can be improved.

Furthermore, since the emission direction of the sound can be flexibly adjusted using only one speaker system, there is no need to install a plurality of speaker boxes to realize a 3D sound. As a result, the space efficiency can be enhanced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
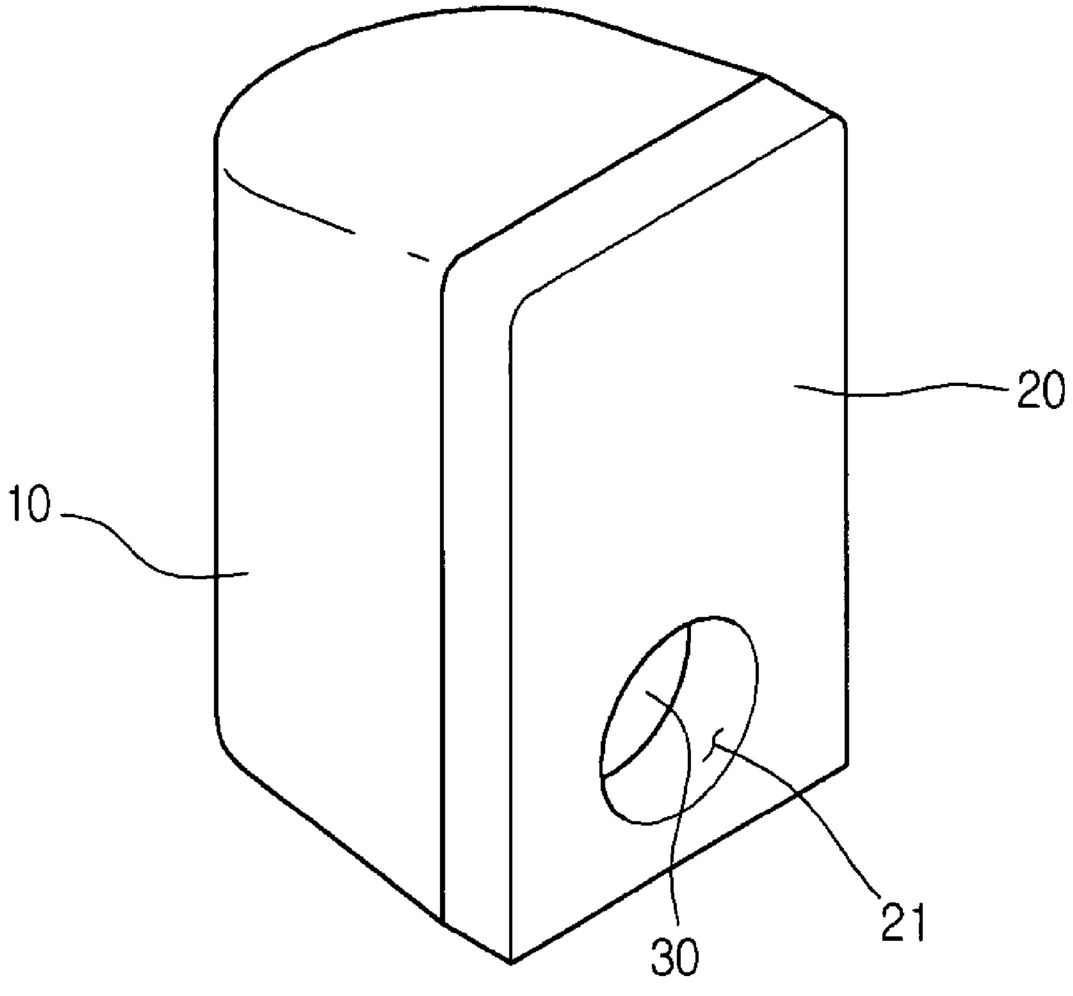
FIG. 1 is a perspective view of a speaker system according to an embodiment of the present invention.

FIG. 1 is a perspective view of a speaker system according to an embodiment of the present invention.

Referring to FIG. 1, a speaker system according to an embodiment of the present invention includes a body unit 10, a front panel 20 slidably coupled to a front surface of the body unit 10, a first speaker unit 30 that is formed on a front-lower end of the body unit 10 to emit sound forward.

In addition, the front panel 20 is provided at a lower end with a hole 21 through which the sound generated from the first speaker unit 30 is transmitted forward. Therefore, unless the front panel 20 coupled to the front surface of the body unit 10 does not slide upward, the sound generated from the first speaker unit 30 is emitted forward through the hole 21.

A speaker grill may be provided on the hole 21 to prevent foreign objects from clogging the first speaker unit 30 and improve an outer appearance.

Figure 2:
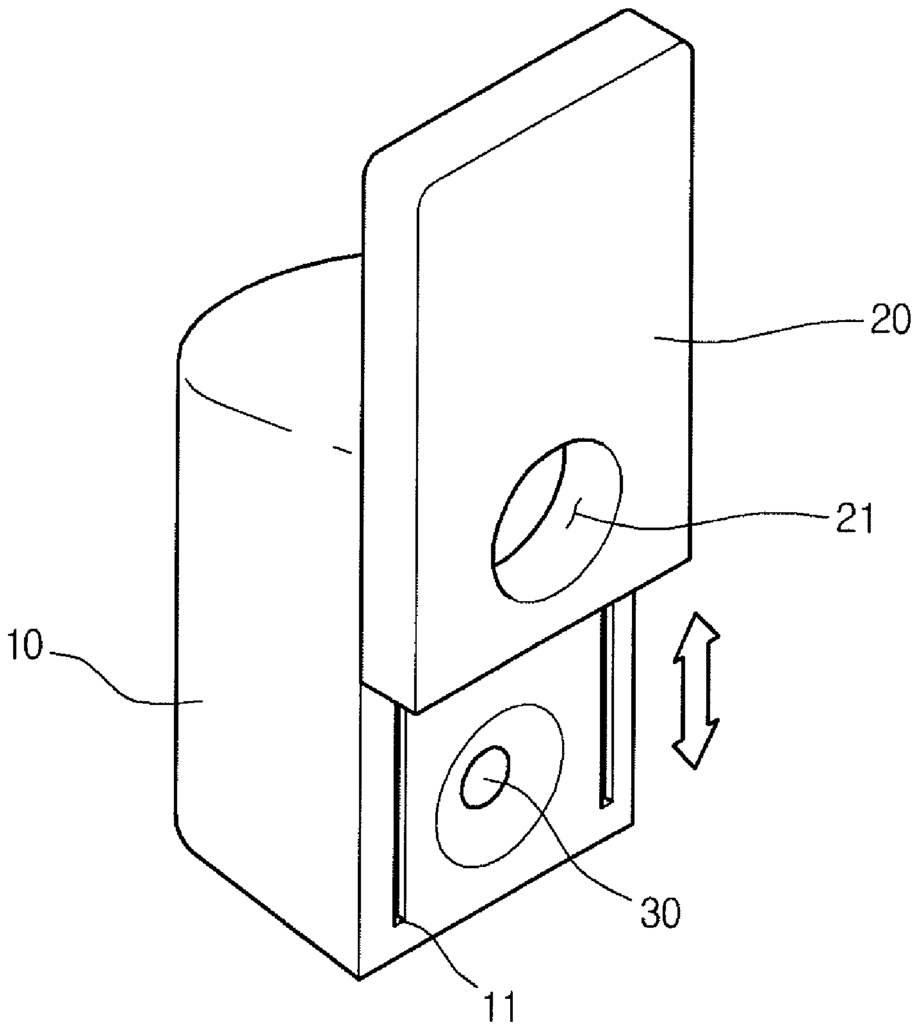
FIGS. 2 and 3 are respectively front and rear perspective views illustrating a state where a front panel of the speaker system of FIG. 1 is in a slide-up state.
Figure 3:
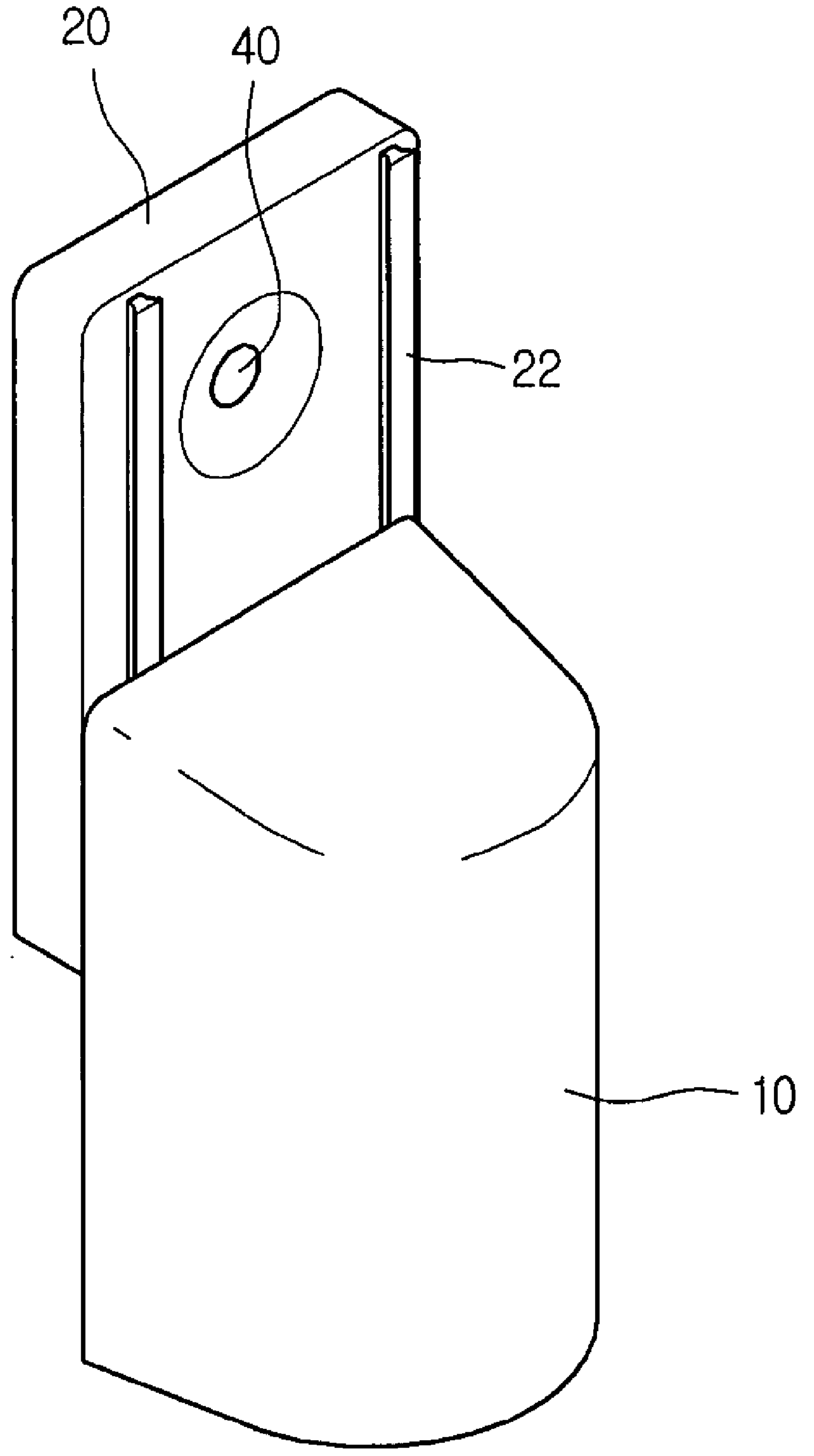

FIGS. 2 and 3 are respectively front and rear perspective views illustrating a state where a front panel of the speaker system of FIG. 1 is in a slide-up state.

Referring to FIGS. 2 and 3, the speaker system of this embodiment further includes a second speaker unit 40 that is formed on an upper-rear surface of the front panel 20 to emit the sound backward when the front panel 20 slides upward.

Here, the second speaker unit 40 is configured to generate the sound only when the front panel 20 slides upward. Therefore, when the user slides up the panel 20, the second speaker unit 40 generates and emits the sound backward. That is, the sound generated by the first speaker unit 30 is emitted forward while the sound generated by the second speaker unit 40 is emitted backward, thereby making it possible to realize a variety of sound filed effects.

The following will describe an operation of the speaker system of the present embodiment of the present invention.

First, when the user intends to emit the sound only forward, as shown in FIG. 1, he/she does not slide up the front panel 20 so that the sound generated by the first speaker unit 30 can be emitted forward through the hole 21.

In this case, the second speaker unit 40 does not generate the sound.

In addition, when the user intends to emit the sound backward as well as forward, he/she slides up the front panel 20. Then, the second speaker 40 also generates and emits the sound backward.

That is, when the user slides up the front panel 20, the sound is generated from the second speaker unit 40 as well as the first speaker unit 30 and thus the sound is emitted forward and backward.

Figure 4:
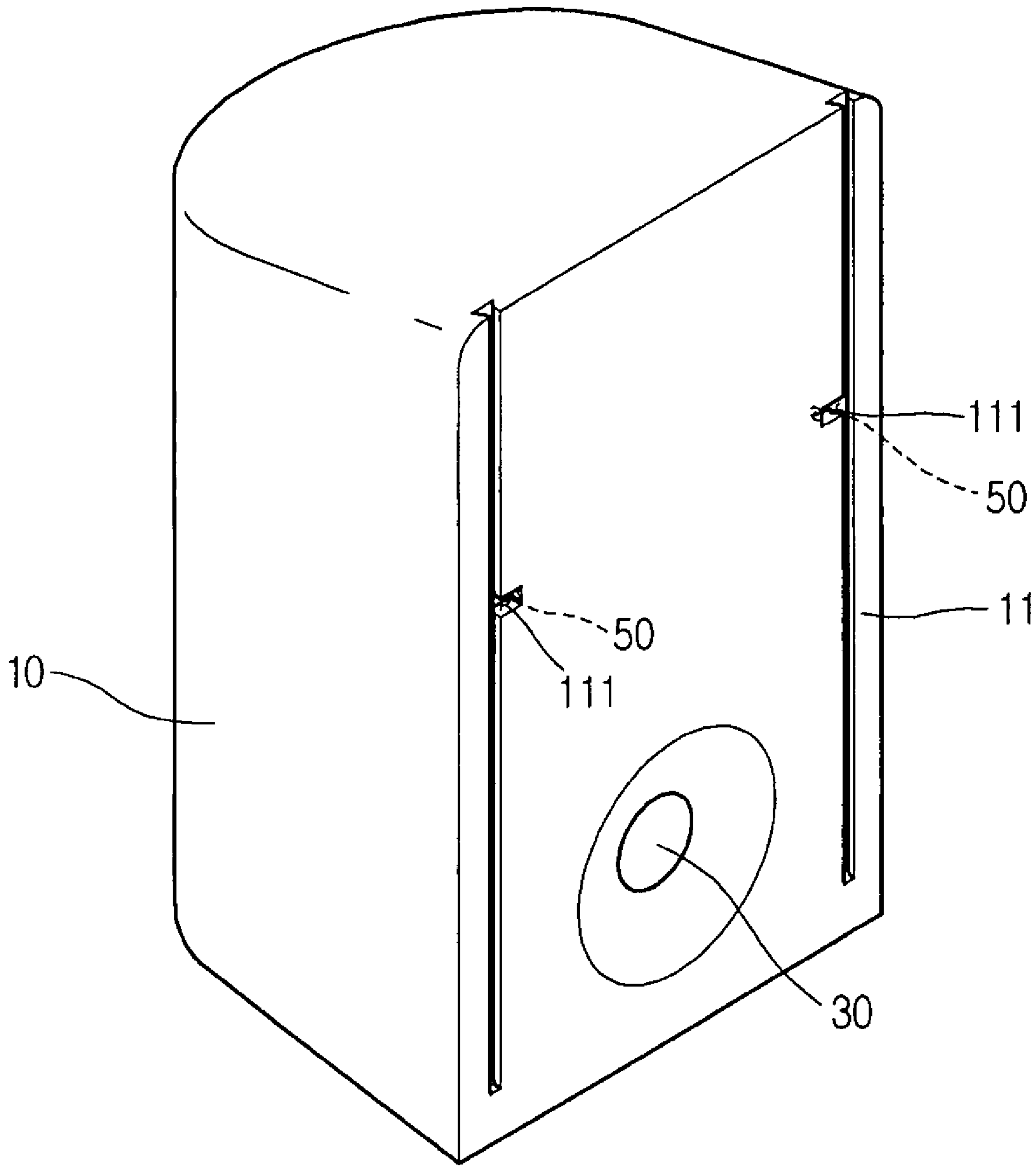
FIG. 4 is a perspective view of a front portion of a body unit of the speaker system of FIG. 1.
Figure 5:
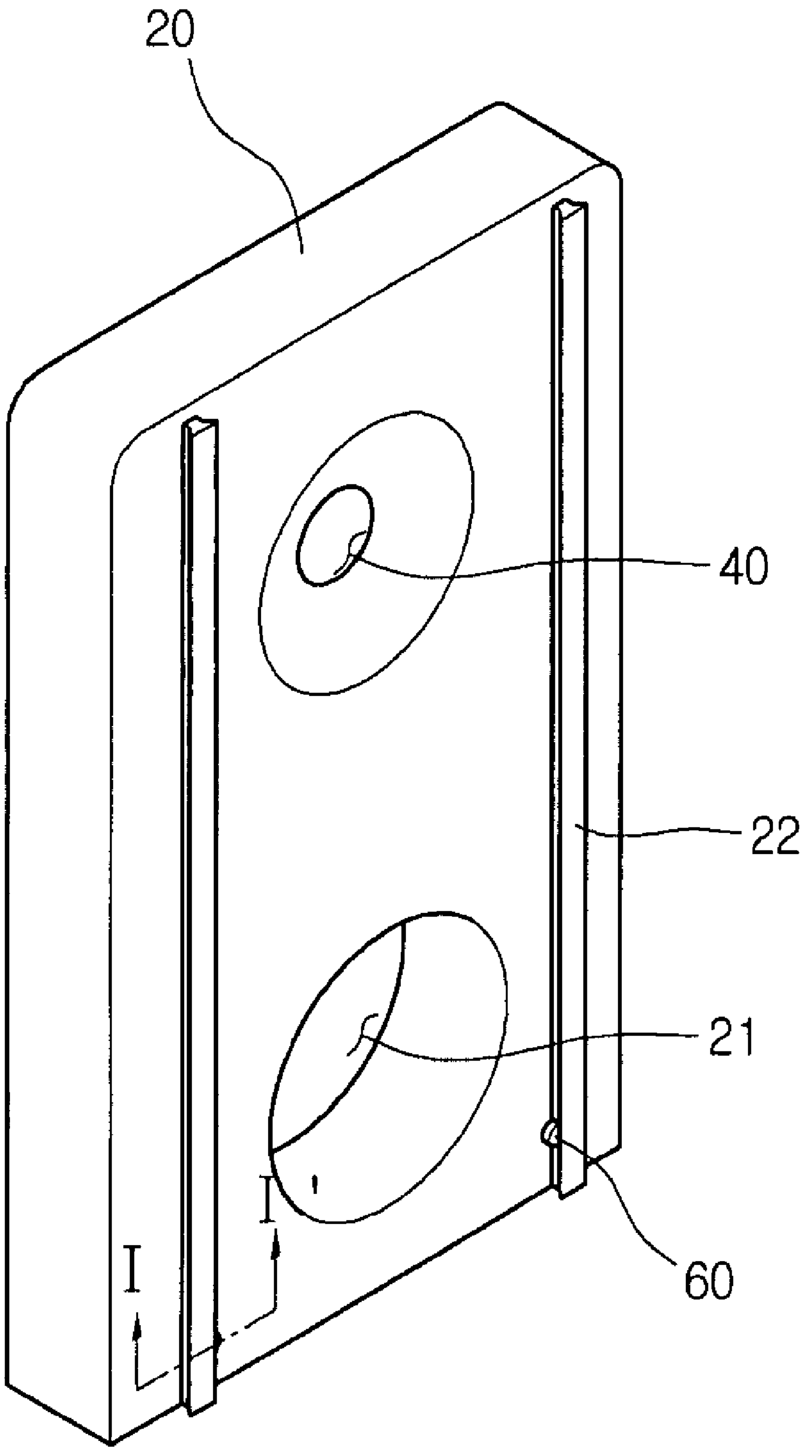
FIG. 5 is a perspective view of a rear portion of a front panel of the speaker system of FIG. 1.

FIG. 4 is a perspective view of a front portion of the body unit of the speaker system and FIG. 5 is a perspective view of a rear portion of the front panel of the speaker system of FIG. 1.

The following will describe a sliding-up operation of the front panel 20 according to one embodiment of the present invention with reference to FIGS. 4 and 5.

Referring to FIGS. 4 and 5, the body unit 10 is provided at the front surface with vertical sliding grooves 11 along which the front, panel 20 slides up and down. The front panel 20 is provided at the rear surface with rails 22 that are slidably inserted in the sliding grooves 11.

In more detail, a stopper groove 111 is formed extending inward from an approximately midpoint of each sliding groove 11. In addition, a stopper projection assembly 60 is formed on a rear end portion of each rail 22. The stopper projection assemblies 60 are inserted in the respective stopper groove 111 while ascending along the respective sliding grooves 11. That is, as the stopper projection assemblies 60 are inserted in the respective stopper grooves 11, the front panel 20 stops as a predetermined height and maintains this stopped state. The stopper projection assembly 60 will be described in more detail later.

The stopper projection assemblies 60 and the stopper grooves 111 may be formed at locations where the first speaker unit 30 and the second speaker unit 40 are not covered by the front panel 20 and the body unit, respective, when the front panel 20 is fixed in a state where it slides up.

At least one of the stopper grooves 111 is provided with a sensor unit 50 that allows the second speaker unit 40 generates the sound only when the front panel 20 slides up and is fixed. Here, the sensor unit 50 may be an optical sensor for detecting the insertion of the stopper projection assembly 60 in the stopper groove 111. Alternatively, the sensor unit 50 may be a micro switch that is turned on by a pressing force generated when the stopper projection assembly 60 is inserted in the stopper groove 111.

Accordingly, the second speaker unit 40 generates the sound only when the front panel slides up such that the stopper projection assemblies 60 are fixedly inserted in the stopper grooves 111. When the front panel 20 slides down such that the stopper projection assemblies 60 get out of the stopper grooves 111, the sound is not generated.

Therefore, when the user intends to emit the sound backward as well as frontward, the user just slides up the front panel 20. When the user intends to emit the sound only frontward, the user just slides down the front panel 20. Therefore, the variety of the sound field effects can be realized by the simple manipulation by the user.

Meanwhile, each of the sliding grooves 11 may be designed to have a width that gradually increases as it goes away from the front panel and each of the rails 22 may be designed to have a width that gradually decreases as it goes away from the body unit 10. As a result, when the front panel 20 is coupled to the body unit 10, the front panel 20 is not separated forward from the body unit 10.

That is, when the front panel 20 is coupled to the front surface of the body unit 10, the outer surfaces of the rails 11 are hooked on an inner surface of the sliding grooves 11. As a result, the front panel 20 can be securely coupled to the body unit 10 without being separated forward from the body unit 10.

Furthermore, the sliding groove 11 may be opened at a top surface of the body unit 10 and closed at a bottom surface of the body unit 10. Then, the front panel 20 may be coupled to the body unit 10 while it slides down from the top surface of the body unit 10 and may be separated from the body unit 10 while it slides up out of the top surface of the body unit 10. Therefore, the coupling of the body unit 10 to the front panel 20 can be more securely realized.

However, the present invention should not be construed as being limited to the above-described coupling structure formed by the rails 22 and the sliding grooves 11. That is, the present invention covers the modifications and variations that can realize the coupling of the front panel 20 to the body unit 10 by sliding down the front panel 20 from the top surface of the body unit 10.

Figure 6:
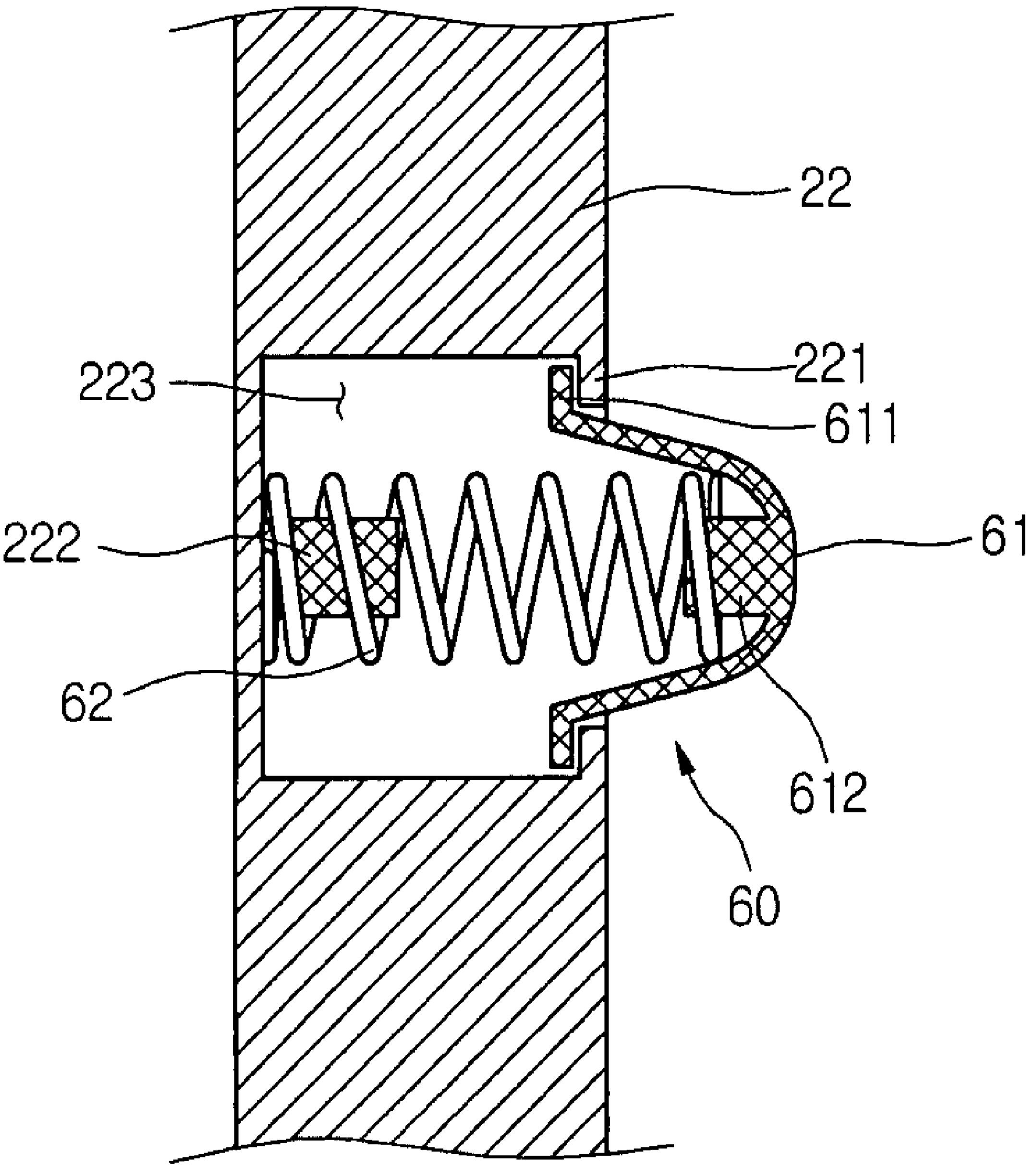
FIG. 6 is a cross-sectional view taken along line I-I' of FIG. 5.

FIG. 6 is a sectional view taken along line I-I' of FIG. 5.

Referring to FIG. 6, the stopper projection assembly 60 is installed in a seating groove 223 formed on the lower end portion of the corresponding rail 22. The seating groove 223 is provided at an opened side with a hook portion 221 protruding inward.

The stopper projection assembly 60 includes a protruding member 61 for inserting in the corresponding stopper groove 111, a stopper flange 611 extending inward from a lower end of the protruding member 61, and an elastic member 62 for biasing the protruding member 61 toward the stopper groove 111.

In more detail, the stopper flange 611 is caught by the hook portion 221 to prevent the protruding member 61 from being removed from the seating groove 223. The seating groove 223 is provided at an inner wall with a support 222 around which an inner end of the elastic member 62 is fitted and supported. The protruding member 61 is provided at an inner surface with a support 612 around which an outer end of the elastic member 62 is fitted and supported.

Therefore, the protruding member 61 is projected out of the seating groove 223 by being biased by the elastic member 62. At this point, since the stopper flange 611 is caught by the hook portion 221, the protruding member 61 is not completely removed from the seating groove 223.

Here, when the front panel 20 is sliding on the front surface of the body unit 10 in a vertical direction, the protruding member 61 compresses the elastic member 62. When the stopper projection assembly 60 is inserted in the stopper groove 11, the protruding member 61 is pushed out of the seating groove 223 by the elastic member 62.

That is, when the protruding member 61 reaches the stopper groove 111 while sliding upward on the front surface of the body unit 10, the protruding member 61 is pushed out of the seating groove 223 by the elastic member 62 and inserted in the stopper groove 111. At this point, when the micro switch is mounted in the stopper groove 111 as the sensing unit 50, the protruding member 61 presses the micro switch while being inserted in the stopper groove 111.

In addition, each of the sliding grooves 11 may be further provided at a lower end portion with a stopper groove (not shown) in which the protruding member 61 can be inserted when the front panel 20 is in a slide-down state.

Then, the front panel 20 can securely maintain the slide-down state thereof.

However, the present invention is not limited by the structured of the above-described stopper projection 60 that is only illustrated only by way of example. That is, the present invention covers the modifications and variations that can realize the stopping of the front panel 20 that slides up and down.

For example, structures similar to the stopper projection assemblies 60 and the stopper grooves 111 may be provided on rear and front surfaces of the respective front panel 20 and body unit 10 instead of the rails 22 and sliding grooves 11. In addition, in order to fix the front panel on a predetermined location of the body unit, a member such as a bearing may be used.

Figure 7:
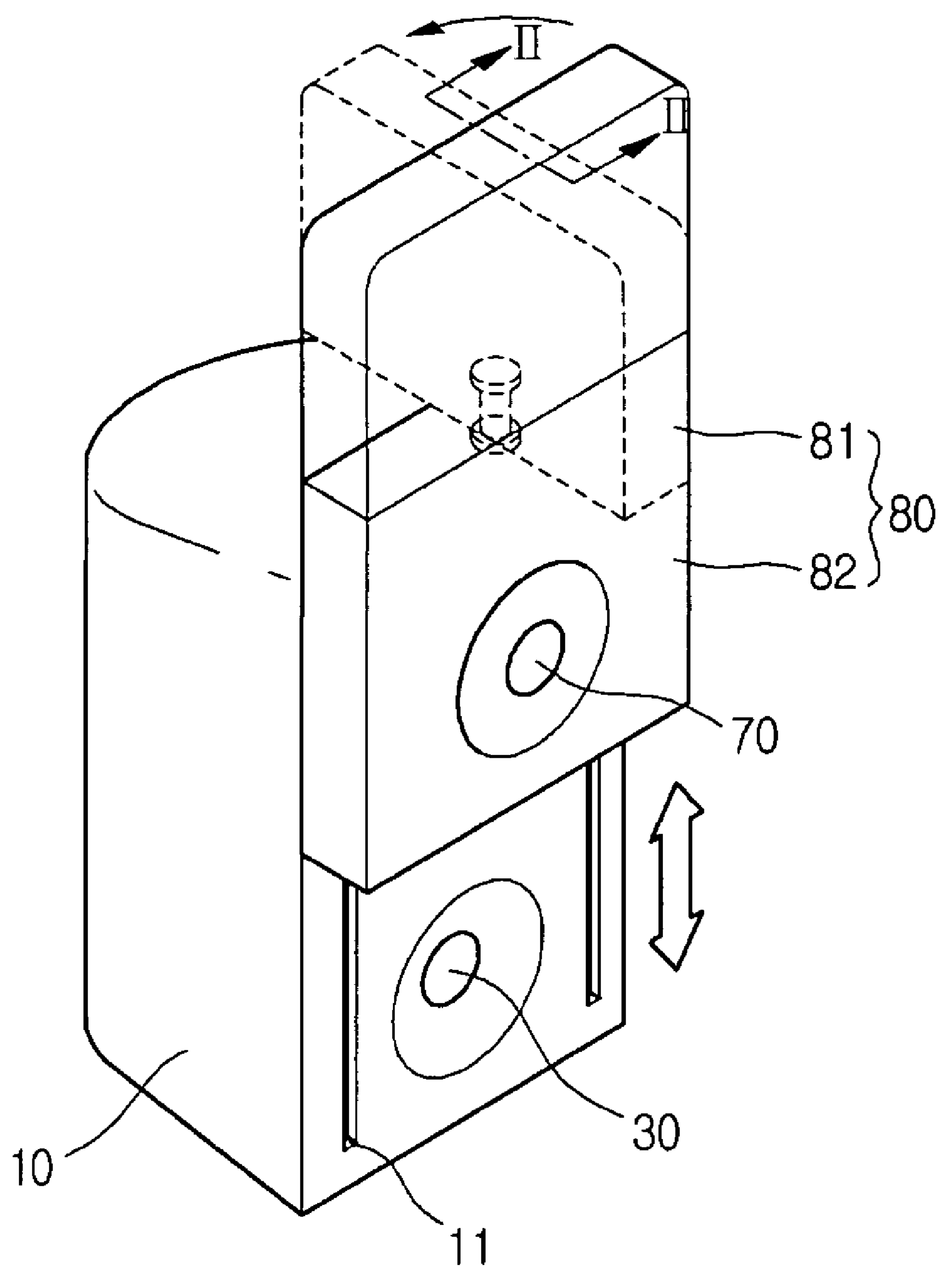
FIGS. 7 and 8 are respectively front and rear perspective views of a speaker system according to another embodiment of the present invention.
Figure 8:
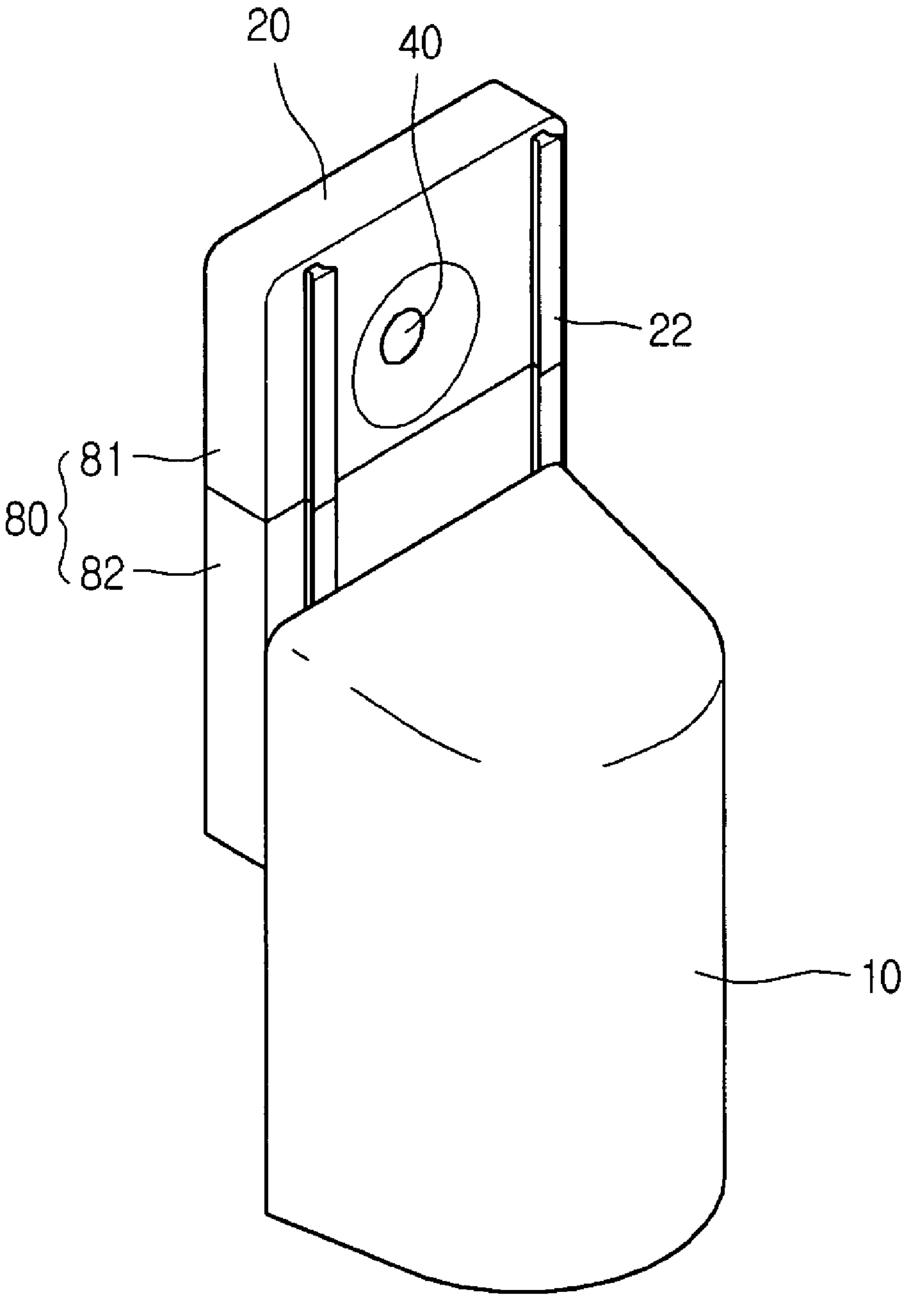

FIGS. 7 and 8 are respectively front and rear perspective views of a speaker system according to a second embodiment of the present invention.

Referring to FIGS. 7 and 8, a speaker system according to another embodiment of the present invention includes a body unit 10, a front panel slidably coupled to a front surface of the body unit 10, a first speaker unit 30 provided on the front surface of the body unit 10, a second speaker unit 40 provided on a rear surface of the front panel 80, and a third speaker unit 70 provided on a front surface of the front panel 80.

In more detail, the speaker system of this embodiment is similar to that of the foregoing embodiment of FIG. 1 except for the front panel 80 is divided into upper and lower halves and provided at opposite surfaces with the speaker units. That is, the front panel 80 includes a panel body 82 that is movable on the front surface of the body unit 10 in a vertical direction and a rotational unit 81 that is coupled to a top of the panel body 82 to be capable of rotating by 180°.

Further, the third speaker unit 70 is provided on the front surface of the panel body 82 and the second speaker unit 40 is provided on the rear surface of the rotational unit 81.

The following will describe an operation of the first, second, and third speaker units 30, 40, and 70.

First, in an initial state where the front panel 80 is in a slide-down state, the sound is emitted only through the third speaker unit 70. When the front panel 80 slides up to a predetermined height, the sound is emitted through the first, second, and third speaker units 30, 40, and 70. At this point, in accordance with the user's intension, the sound may be emitted only forward by rotating the rotational unit 81 by 180°. Here, since the structure for fixing the front panel 80 at the predetermined height and the structure for sensing the sliding-up of the front panel 80 may be identical to those of the foregoing embodiment of FIGS. 1 through 6, the detailed description thereof will be omitted herein.

As another operational structure that can be proposed, a structure for ascending the front panel 80 in a two-step manner.

In more detail, the speaker units may be controlled such that the front panel 80 may be firstly ascended up to a half of the body unit 10 to completely expose the first speaker unit 30 and secondarily ascended up to a top of the body unit 10 such that a lower end of the front panel 80 to be in an identical level to an upper end of the body unit 10.

That is, in the initial state where the front panel 80 does not slide up, no sound is output. When the front panel 80 is ascended up to the half of the body unit 10, the sound is output through the first speaker unit 30. When the front panel 80 is further ascended up to the top of the body unit 10, the third speaker unit 70 is turned on and the sound is output through the first and third speaker units 30 and 70. Here, the second speaker unit 40 may be turned on simultaneously with the turning on of the first speaker unit 30 or the third speaker unit 70. Although not shown in the drawings, a fixing unit for fixing the front panel 80 should be provided. This fixing unit may be realized by a variety of structures including the structure of the foregoing embodiment of FIGS. 1 through 6.

Figure 9:
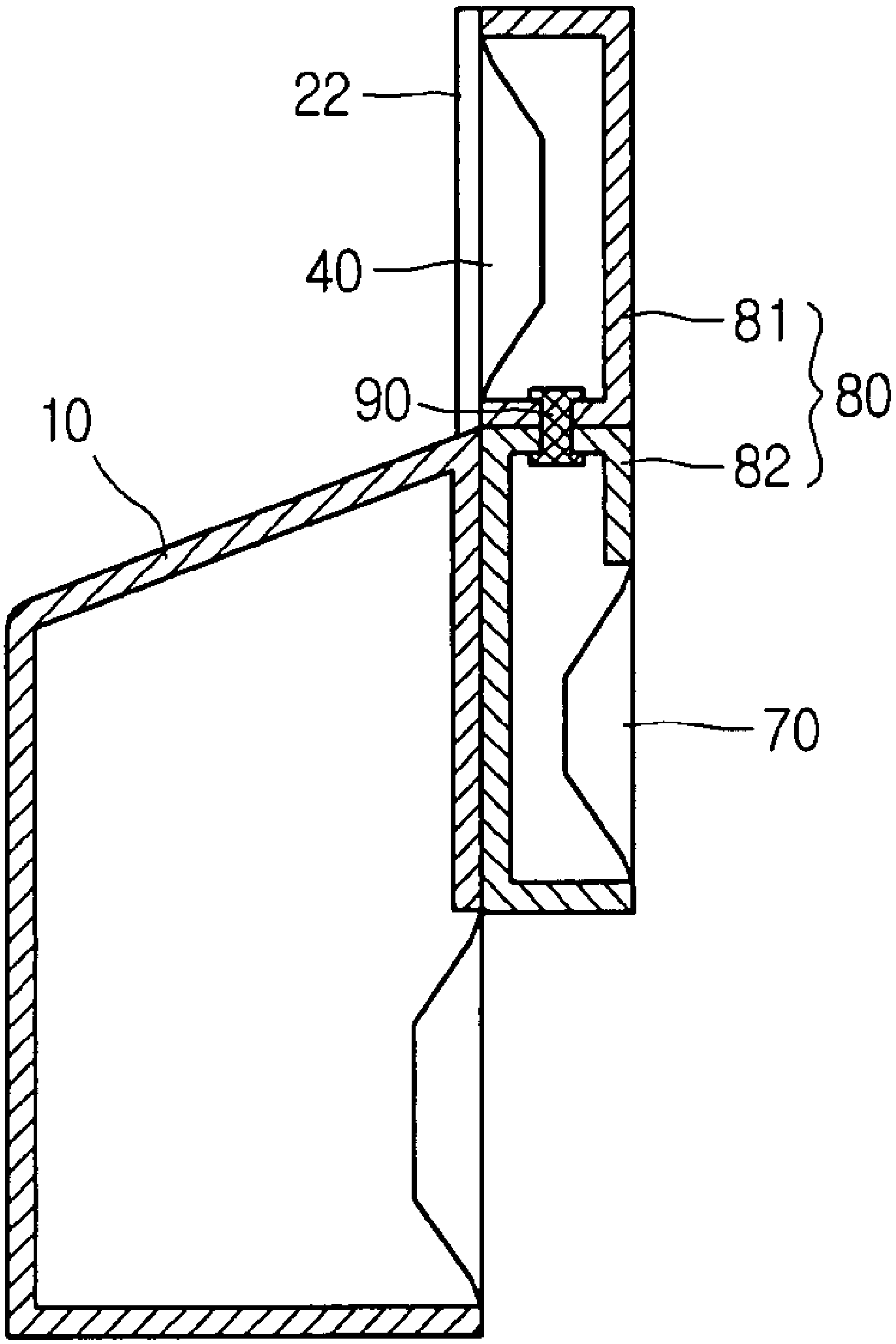
FIG. 9 is a sectional view taken along line II-II' of FIG. 7.
Figure 10:
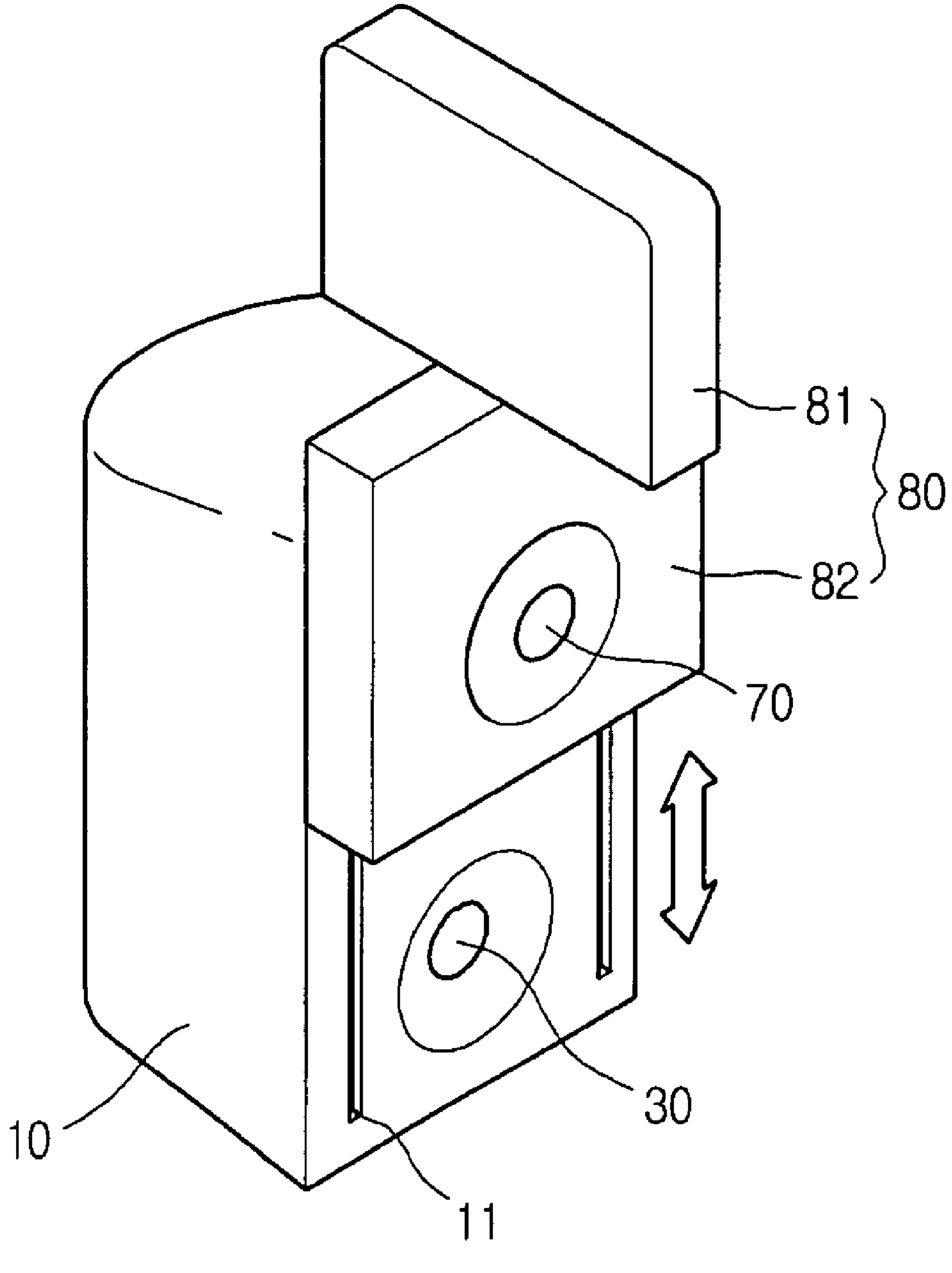
FIG. 10 is a perspective view illustrating an operation state of the speaker system of FIGS. 7 and 8.

FIG. 9 is a sectional view taken along line II-II' of FIG. 7, and FIG. 10 is a perspective view illustrating an operation state of the speaker system of FIGS. 7 and 8.

Referring to FIGS. 9 and 10, the speaker system according to this embodiment includes the front panel 80, the rotational unit 81, and the panel body 82. The rotational unit 81 is coupled to the top of the panel body to be capable of rotating by 360°. A rotational shaft 90 is inserted through a lower end of the rotational unit 81 and an upper end of the panel body 82 so that the rotational unit 81 can stably rotate on the top surface of the panel body 82.

With the above-described structure, the user can dispose the speaker units such that all or some of the speaker units are oriented frontward, thereby easily realizing a desired sound field effect he/she wants.

Furthermore, in the foregoing embodiments, the front panel is configured to slide in a vertical direction. However, the present invention is not limited to this configuration. For example, the front panel is configured to slide in a horizontal direction.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A speaker system comprising:

a body unit;

a front panel slidably coupled to a front surface of the body unit;

a first speaker unit that is provided on the front surface the body unit to output sound; and a second speaker unit that is provided on a rear surface of the front panel to output sound, wherein the first speaker unit is formed on a front-lower portion of the body unit and the second speaker unit is formed on a rear-upper portion of the front panel, and wherein the front panel is provided at the front-lower portion with a hole through which the sound generated by the first speaker unit is emitted forward.

2. The speaker system according to claim 1, wherein the front panel is coupled to the body unit to be capable of sliding in a vertical or horizontal direction.

3. The speaker system according to claim 1, wherein the second speaker unit is turned on when the front panel slides up.

4. The speaker system according to claim 1, further comprising a fixing unit provided on the rear surface of the front panel and the front surface of the body unit to fix the front panel when the front panel slides up to a predetermined height.

5. The speaker system according to claim 1, further comprising one or more rails provided on one of the front surface of the body unit and the rear surface of the front panel and one or more sliding grooves that are provided on the other of the front surface of the body unit and the rear surface of the front panel to receive the rails.

6. The speaker system according to claim 1, further comprising a third speaker unit provided on a front surface of the front panel.

7. The speaker system according to claim 1, wherein a portion of the front panel on which the second speaker unit is provided is capable of rotating.

8. A speaker system comprising:

a body unit;

a front panel slidably coupled to a front surface of the body unit;

a guide unit for allowing the front panel to be slidably coupled to the body unit;

a first speaker unit that is provided on the front surface the body unit to output sound; and a second speaker unit that is provided on a rear surface of the front panel to output sound, the second speaker unit being turned on when the first speaker unit is exposed, wherein the guide unit includes:

one or more rails which are provided on one of the rear surface of the front panel and the front surface of the body unit; and one or more guide grooves which are provided on the other one of the rear surface of the front panel and the front surface of the body unit to receive the rails.

9. The speaker system according to claim 8, further comprising a stopper projection assembly provided to be capable of going in and coming out of a side surface of the rail and a stopper groove formed on a side surface of the guide groove to receive the stopper projection assembly.

10. The speaker system according to claim 8, further comprising a stopper unit allowing the front panel to slide up and down in a multiple step on the front surface of the body unit.

11. The speaker system according to claim 10, wherein the stopper unit includes a bearing.

12. The speaker system according to claim 8, wherein the front panel is provided at a lower portion with a hole through which the sound output from the first speaker unit passes, and the front panel is provided at an upper portion with the second speaker unit.

13. The speaker system according to claim 8, wherein the front panel is provided at a lower portion with a third speaker unit and at an upper portion with the second speaker.

14. The speaker system according to claim 13, the front panel includes a panel body provided with the third speaker unit, a rotational unit that is rotatably coupled to a top of the panel body and provided with the second speaker unit, and a rotational shaft connecting the panel body to the rotational unit.

15. A speaker system comprising:

a body unit disposed on a base floor and provided at a front surface with a first speaker unit;

a front panel that is coupled to a front surface of the body unit to be capable of sliding in a multiple-step and provided at a rear surface with a second speaker unit; and a sensing unit for sensing a sliding state of the front panel, wherein the second speaker unit faces the front surface when the front panel is in a lowered position.

16. The speaker system according to claim 15, further comprising a fixing unit for fixing the front panel at a predetermined height, wherein the sensing unit is a micro switch which senses the sliding state of the front panel by contacting the fixing unit.

17. The speaker system according to claim 15, further comprising a fixing unit for fixing the front panel at a predetermined height, wherein the sensing unit is an optical sensor detecting an approach of the fixing unit.

18. The speaker system according to claim 15, the first speaker unit is turned on when it is exposed to an external side in a state where the front panel slides up.

19. The speaker system according to claim 15, wherein the first and second speaker units are turned off when the front panel completely slides down.

20. The speaker system according to claim 15, further comprising a third speaker unit provided on a front-lower portion of the front panel.

21. The speaker system according to claim 15, wherein the front panel forms an exterior surface of the speaker system when in a lowered position.

* * * * *